United States Patent
Komiya et al.

(10) Patent No.: US 7,310,277 B2
(45) Date of Patent: Dec. 18, 2007

(54) NON-VOLATILE SEMICONDUCTOR STORAGE DEVICE WITH SPECIFIC COMMAND ENABLE/DISABLE CONTROL SIGNAL

(75) Inventors: Manabu Komiya, Kyoto (JP);
Yasuhiro Tomita, Toyonaka (JP);
Hitoshi Suwa, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/113,046

(22) Filed: Apr. 25, 2005

(65) Prior Publication Data

US 2005/0243616 A1    Nov. 3, 2005

(30) Foreign Application Priority Data

Apr. 28, 2004   (JP) .............................. 2004-134486

(51) Int. Cl.
*G11C 7/00* (2006.01)
(52) U.S. Cl. .................. 365/191; 365/195; 365/185.04
(58) Field of Classification Search ................ 365/191, 365/195, 185.04
See application file for complete search history.

(56) References Cited

U.S. PATENT DOCUMENTS

| | | | |
|---|---|---|---|
| 5,559,989 A | | 9/1996 | Sourgen et al. |
| 5,881,002 A | * | 3/1999 | Hamakawa .................. 365/195 |
| 6,260,172 B1 | | 7/2001 | Hazama |
| 6,266,271 B1 | * | 7/2001 | Kawamura ............. 365/185.04 |
| 6,529,418 B2 | * | 3/2003 | Nakai et al. ........... 365/185.33 |
| 6,549,480 B2 | * | 4/2003 | Hosogane et al. .......... 365/226 |
| 6,711,055 B2 | * | 3/2004 | Kawamata ............. 365/185.04 |
| 6,950,345 B1 | * | 9/2005 | Tokiwa .................. 365/185.22 |
| 6,996,692 B2 | * | 2/2006 | Kouno ....................... 711/164 |

FOREIGN PATENT DOCUMENTS

JP   7-182885   7/1995

* cited by examiner

*Primary Examiner*—Hoai V. Ho
(74) *Attorney, Agent, or Firm*—McDermott Will & Emery LLP

(57) ABSTRACT

The non-volatile semiconductor storage device 101 includes the specific command Enable/Disable signal lines 120 connected to the command decoder 108. The specific command Enable/Disable signals are externally inputted to the command decoder 108 through the signal lines 120. Thereby, when the device 101 is initialized, the command decoder 108 enables the specific command and the device 101 can shift to a mode corresponding to the specific command. On the other hand, the command decoder 108 can disable the specific command, for example, when a user uses the device 101, thereby preventing the specific command from being executed even when the specific command is erroneously issued.

1 Claim, 4 Drawing Sheets

NON-VOLATILE SEMICONDUCTOR STORAGE DEVICE WITH SPECIFIC COMMAND ENABLE/DISABLE CONTROL SIGNAL

BACKGROUND OF THE INVENTION

1. Field of the Invention

The present invention relates to a non-volatile semiconductor storage device, and more particularly to a non-volatile semiconductor storage device capable of electrically erasing and programming data.

2. Description of the Background Art

Some non-volatile semiconductor storage devices perform operations such as programming, erasing, and various controls on the basis of commands from an external device. Further, the non-volatile semiconductor storage device has some modes so as to be initialized during the manufacturing process. The mode is switched on the basis of the commands externally supplied. However, when a user arbitrarily changes the initial setting, the non-volatile semiconductor storage device malfunctions. Therefore, the non-volatile semiconductor storage device is constructed such that the user cannot execute commands for shifting to modes for performing the initial setting. Commands for shifting a mode to various test modes are taken as examples of commands which the user is prohibited from executing as described above. As an example of such command, a command for reading or writing configuration data in the non-volatile semiconductor storage device can be taken.

Further, the non-volatile semiconductor storage device is provided with a command which is to be set by a user so as to or so as not to be prohibited from being executed. As an example of such command, a command for protecting a predetermined memory area (hereinafter, referred to as a protect command) can be taken. The protect command is a command for prohibiting programming into or erasing from the predetermined memory area to protect the data and programs stored in the memory area from the damage caused by runaway of CPU, noise, or the like.

As described above, a command which is executed at the initialization and prohibited from being executed by a user and a command which is to be set, by a user, so as to be prohibited from being executed, are referred to as a "specific command". Hereinafter, a protect command is taken as an example of the specific command.

A construction of a prior art non-volatile semiconductor storage device will be described with reference to the drawings. FIG. 4 is a block diagram illustrating a typical construction of the prior art non-volatile semiconductor storage device. The non-volatile semiconductor storage device 401 shown in FIG. 4 comprises a memory cell array 402, an erasure block 402a, a configuration data storage area 402b, an address decoder 403, a reading/programming circuit 404, an erasing and programming control circuit 405, a protection data programming control circuit 405a, a power supply circuit 406, a control circuit 407, a command decoder 408, a data multiplexer (Data MUX) 409, a data processing unit (DPU) 410, protect registers 411, a protect information signal line 412, an erasing and programming prohibition circuit 413, an address counter 414, an input/output data bus 415, an output bus 416, and an input bus 417.

Next, a process of executing a protect command to protect an erasure block 402a will be described. Initially, the protect command and an address of a target erasure block 402a to be protected are inputted to the command decoder 408. The command decoder 408 decodes the inputted protect command and outputs the resultant signal to the control circuit 407.

The control circuit 407 outputs a protection instruction to the protection data programming control circuit 405a on the basis of the signal outputted from the command decoder 408, thereby to control the address counter 414 and the DPU 410 and set the number of the target erasure block 402a to be protected in the configuration data storage area 402b. Further, the control circuit 407 transfers, through the reading/programming circuit 404, data for protecting the erasure block 402a to the protect register 411 corresponding to the number of the target erasure block 402a. Thereby, the erasure block 402a is protected, thereby protecting the data and programs stored in the block.

However, in general, once the memory area is protected, the memory area cannot be easily unprotected. Therefore, the memory area which has been protected by erroneously executing a protect command due to runaway of CPU, noise or the like becomes a faulty area. Moreover, in a case where a command for shifting to a test mode is erroneously issued, there is a possibility of the configuration data being erased and programmed, thereby resulting in a malfunction in the non-volatile semiconductor storage device in some cases.

SUMMARY OF THE INVENTION

Therefore, an object of the present invention is to provide a non-volatile semiconductor storage device which prohibits a specific command from being executed in a case where the specific command is erroneously issued.

The non-volatile semiconductor storage device according to the present invention comprises a memory cell array including a plurality of non-volatile memory cells, a command decoder for decoding commands externally supplied thereto, and a control circuit for controlling the memory cell array on the basis of a result of the decoding performed by the command decoder, wherein at least one specific command control signal, for controlling whether or not at least one command among commands which can be executed is permitted to be executed, is inputted to the command decoder, and the command decoder outputs the result of the decoding based on the specific command control signal.

In this case, it is preferable that the specific command control signal is externally supplied thereto.

Alternatively, the non-volatile semiconductor storage device according to the present invention further comprises at least one register for storing data in a volatile manner under the control of the control circuit, wherein the specific command control signal is outputted from the register.

Alternatively, initial data are stored in memory cells in the memory cell array, and the control circuit may read the initial data and transmit the read initial data to the register at a predetermined timing.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
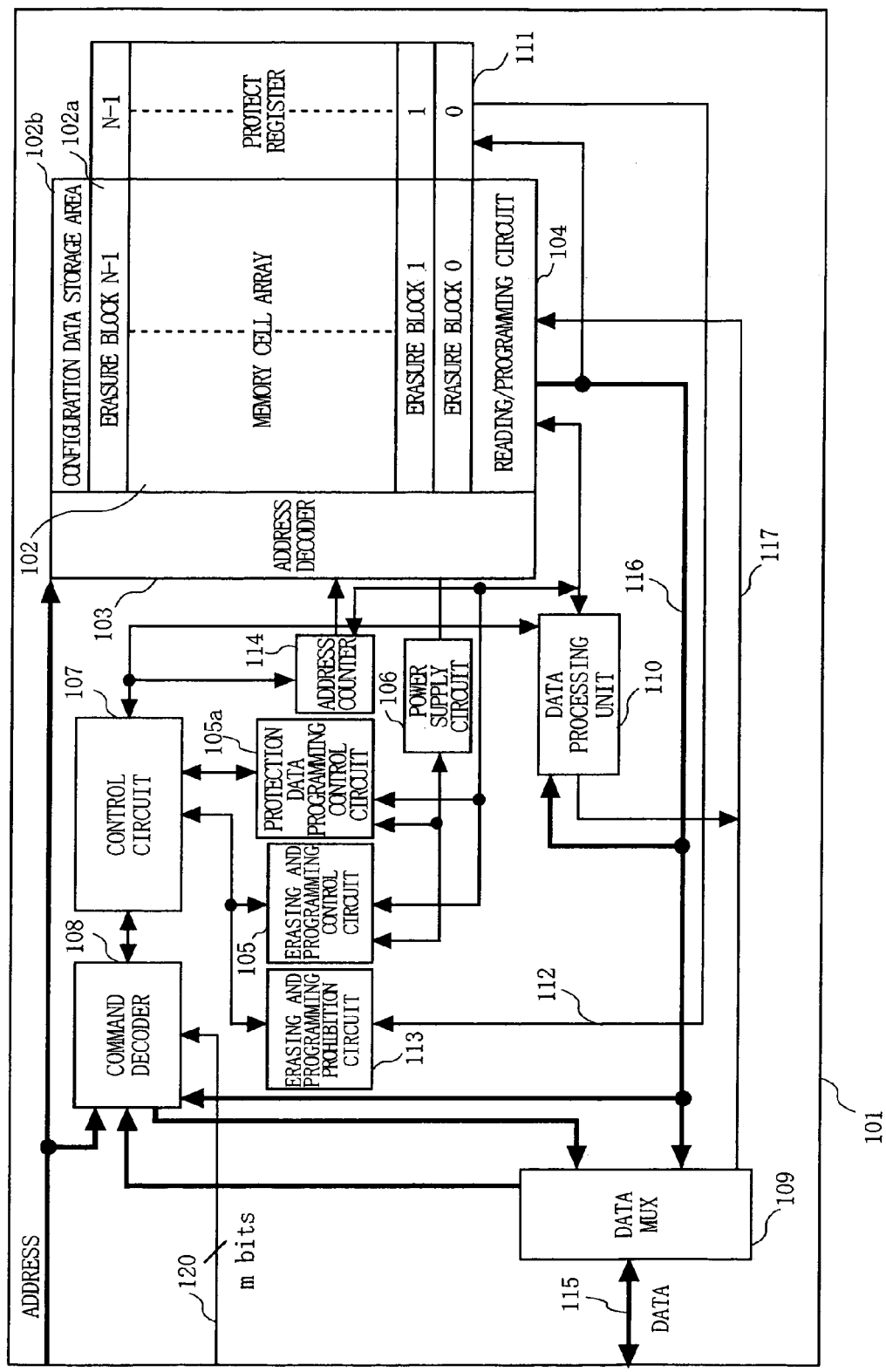
FIG. 1 is a block diagram illustrating a construction of a non-volatile semiconductor storage device according to a first embodiment of the present invention.

Hereinafter, embodiments of the present invention will be described with reference to the drawings. FIG. 1 is a block diagram illustrating a construction of a non-volatile semiconductor storage device according to a first embodiment of the present invention.

The non-volatile semiconductor storage device 101 shown in FIG. 1 includes a memory cell array 102, an erasure block 102a, a configuration data storage area 102b, an address decoder 103, a reading/programming circuit 104, an erasing and programming control circuit 105, a protection data programming control circuit 105a, a power supply circuit 106, a control circuit 107, a command decoder 108, a data multiplexer (Data MUX) 109, a data processing unit (DPU) 110, protect registers 111, a protect information signal line 112, an erasing and programming prohibition circuit 113, an address counter 114, an input/output data bus 115, an output bus 116, an input bus 117, and specific command Enable/Disable signal lines 120. The non-volatile semiconductor storage device 101 is characterized by having the specific command Enable/Disable signal lines 120.

The memory cell array 102 is formed by arranging non-volatile memory cells as an array. Further, the erasure block 102a is a block comprising a plurality of memory cells. The memory cells are erased, or erased and programmed in units of the erasure block. The memory cell array 102 shown in FIG. 1 comprises N pieces of erasure blocks 102a.

The configuration data storage area 102b is an area in the memory cell array 102 and stores information on protection, trimming data and the like. The address decoder 103 decodes an address inputted externally to the non-volatile semiconductor storage device 101. The reading/programming circuit 104 applies a high voltage to a drain of a memory cell to be accessed when reading data from the memory cell array 102 and when programming data into the memory cell array 102. The erasing and programming control circuit 105 controls erasing and programming of data in the memory cell. The protection data programming control circuit 105a programs data for protecting the erasure block 102a into the configuration data storage area 102b.

The power supply circuit 106 includes a booster circuit which generates a voltage higher than the power supply voltage, and the like. The control circuit 107 includes an erase and program algorithm controller. The command decoder 108 decodes a command inputted externally to the non-volatile semiconductor storage device 101. The Data MUX 109 switches between input and output of data. The DPU 110 generates data to be programmed and an expected value for erasing and programming.

The number of protect registers 111 provided is the same as the number of erasure blocks 102a (N pieces), and each of the protect registers 111 corresponds to one erasure block 102a. The protect register 111 stores data for controlling whether or not the corresponding erasure block 102a is to be protected, in a volatile manner. Further, the protect register 111 outputs a protect information signal to the erasing and programming prohibition circuit 113 through the protect information signal line 112. The erasing and programming prohibition circuit 113 controls whether or not the erasing from and programming into the memory cell array 102 is to be permitted according to the protect information signal.

The address counter 114 internally generates an address. The input/output data bus 115 is a bus for an input of a command or data input/output. The output bus 116 is a bus for data outputted from the reading/programming circuit 104. The input bus 117 is a bus for externally receiving data to be programmed, and the like.

The specific command Enable/Disable signal lines 120 are connected to the command decoder 108. The specific command Enable/Disable signal line 120 is a signal line for inputting a signal for controlling whether or not a specific command is to be executed (hereinafter, referred to as a specific command Enable/Disable signal), to the command decoder 108 from the outside of the non-volatile semiconductor storage device 101. The command decoder 108 enables the specific command while the specific command Enable/Disable signal of "H" level is being inputted.

To be more specific, in a case where the command decoder 108 receives a specific command while the specific command Enable/Disable signal of "H" level is being inputted, the command decoder 108 decodes the specific command. On the other hand, in a case where the command decoder 108 receives a specific command while the specific command Enable/Disable signal of "L" level is being inputted, the command decoder 108 does not decode the specific command. Moreover, in a case where the command decoder 108 receives a command other than a specific command, the command decoder 108 decodes the command regardless of whether the specific command Enable/Disable signal is "H" level or "L" level.

The number of specific command Enable/Disable signal lines 120 provided is the same as the number of specific commands. Thereby, the command decoder 108 can be controlled as to whether or not the command decoder 108 enables each specific command. "m bits" shown in FIG. 1 indicates that m pieces of specific command Enable/Disable signal lines 120 corresponding to m pieces of specific commands are provided.

Hereinafter, a process of executing a protect command to protect an erasure block 102a is taken as an example for execution of the specific command. Initially, the specific command Enable/Disable signal line 120 corresponding to the protect command is selected, and through the signal line the specific command Enable/Disable signal of "H" level is inputted to the command decoder 108. Thereby, the command decoder 108 enables the protect command. Next, the protect command and the address of the target erasure block 102a to be protected are inputted to the command decoder 108. The command decoder 108 decodes the inputted protect command and outputs the resultant signal to the control circuit 107.

The control circuit 107 outputs a protection instruction to the protection data programming control circuit 105a on the basis of the signal outputted from the command decoder 108, thereby to control the address counter 114 and the DPU 110 and set the number of the erasure block 102a in the configuration data storage area 102b. Further, the control circuit 107 transmits, through the reading/programming circuit 104, data for protecting the erasure block 102a to the protect register 111 corresponding to the number of the erasure block 102a. Thereby, the erasure block 102a is protected.

The protection of the erasure block 102a is completed and thereafter the specific command Enable/Disable signal for the protect command becomes "L" level, and then the command decoder 108 disables the protect command.

One end of the specific command Enable/Disable signal line 120 is connected to an external connection terminal of the non-volatile semiconductor storage device 101. When the specific command is executed (for example, when initialized), a voltage of "H" level is applied to the external connection terminal. On the other hand, when the specific command is prohibited (for example, when used by a user), the potential of the external connection terminal is fixed to be "L" level.

As described above, the non-volatile semiconductor storage device according to this embodiment is provided with the specific command Enable/Disable signal lines, wherein a specific command Enable/Disable signal is inputted to the command decoder. The command decoder enables or disables the specific command according to the specific command Enable/Disable signal. Thereby, even when the specific command is erroneously issued, the specific command can be prevented from being executed.

Figure 2:
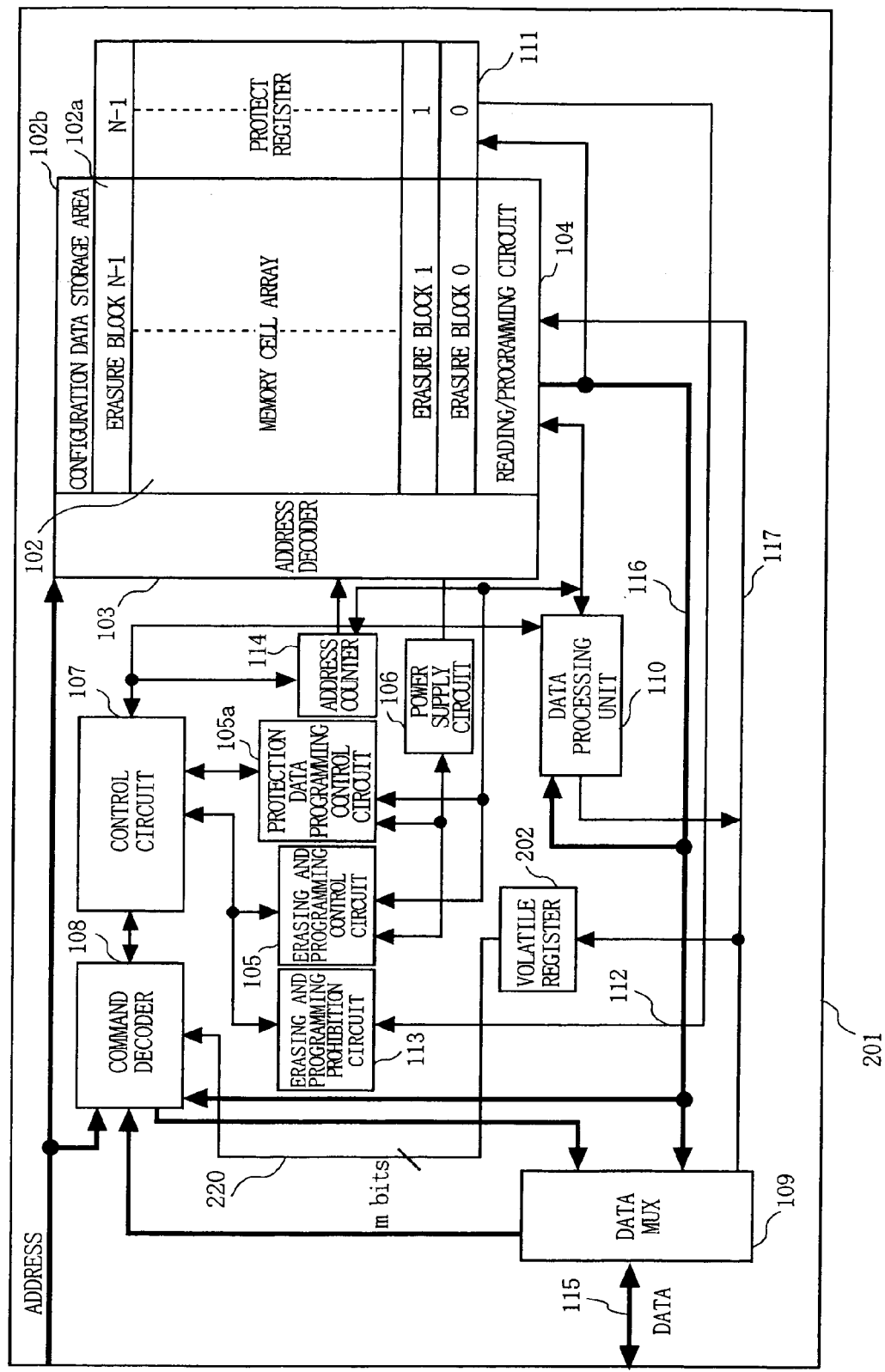
FIG. 2 is a block diagram illustrating a construction of a non-volatile semiconductor storage device according to a second embodiment of the present invention.

FIG. 2. is a block diagram illustration a construction of a non-volatile semiconductor storage device according to a second embodiment of the present invention. The non-volatile semiconductor storage device 201 according to the second embodiment is provided with volatile registers 202 and specific command Enable/Disable signal lines 220, instead of the specific command Enable/Disable signal lines 120 included in the non-volatile semiconductor storage device 101 according to the first embodiment. Among the constituents of the second embodiment, the same constituents as those described in the first embodiment are denoted by the same reference numerals and the description thereof is omitted.

Data for controlling whether or not specific commands are to be enabled are inputted to the volatile registers 202 from the outside of the non-volatile semiconductor storage device 201 through the input/output data bus 115 at a predetermined timing after the start-up. The volatile registers 202 store the inputted data and output specific command Enable/Disable signals to the command decoder 108.

In the non-volatile semiconductor storage device 201, the number of volatile registers 202 provided is the same as the number of specific commands. Each of the volatile registers 202 is correspondingly connected to one of the specific command Enable/Disable signal lines 220. The specific command Enable/Disable signal is inputted to the command decoder 108 from the volatile register 202 through the specific command Enable/Disable signal line 220. "m bits" shown in FIG. 2 indicates that m pieces of specific command Enable/Disable signal lines 220 are connected to m pieces of volatile registers 202 and the command decoder 108.

When a specific command is executed (for example, when initialized), the specific command Enable/Disable signal of "H" level is outputted from the volatile register corresponding to the specific command among m pieces of volatile registers 202. The signal is inputted to the command decoder 108 through the corresponding specific command Enable/Disable signal line 220. Thereby, the command decoder 108 enables the specific command.

On the other hand, when a specific command is prohibited from being executed (for example, when used by a user), the specific command Enable/Disable signal of "L" level is outputted from the volatile register corresponding to the specific command among m pieces of volatile register 202. Thereby, the command decoder 108 disables the specific command.

As described above, the non-volatile semiconductor storage device according to this embodiment is provided with volatile registers which store data for controlling whether or not the specific command is to be enabled. The volatile register outputs the specific command Enable/Disable signal to the command decoder. Thereby, even when the specific command is erroneously issued, the specific command can be prevented from being executed.

Figure 3:
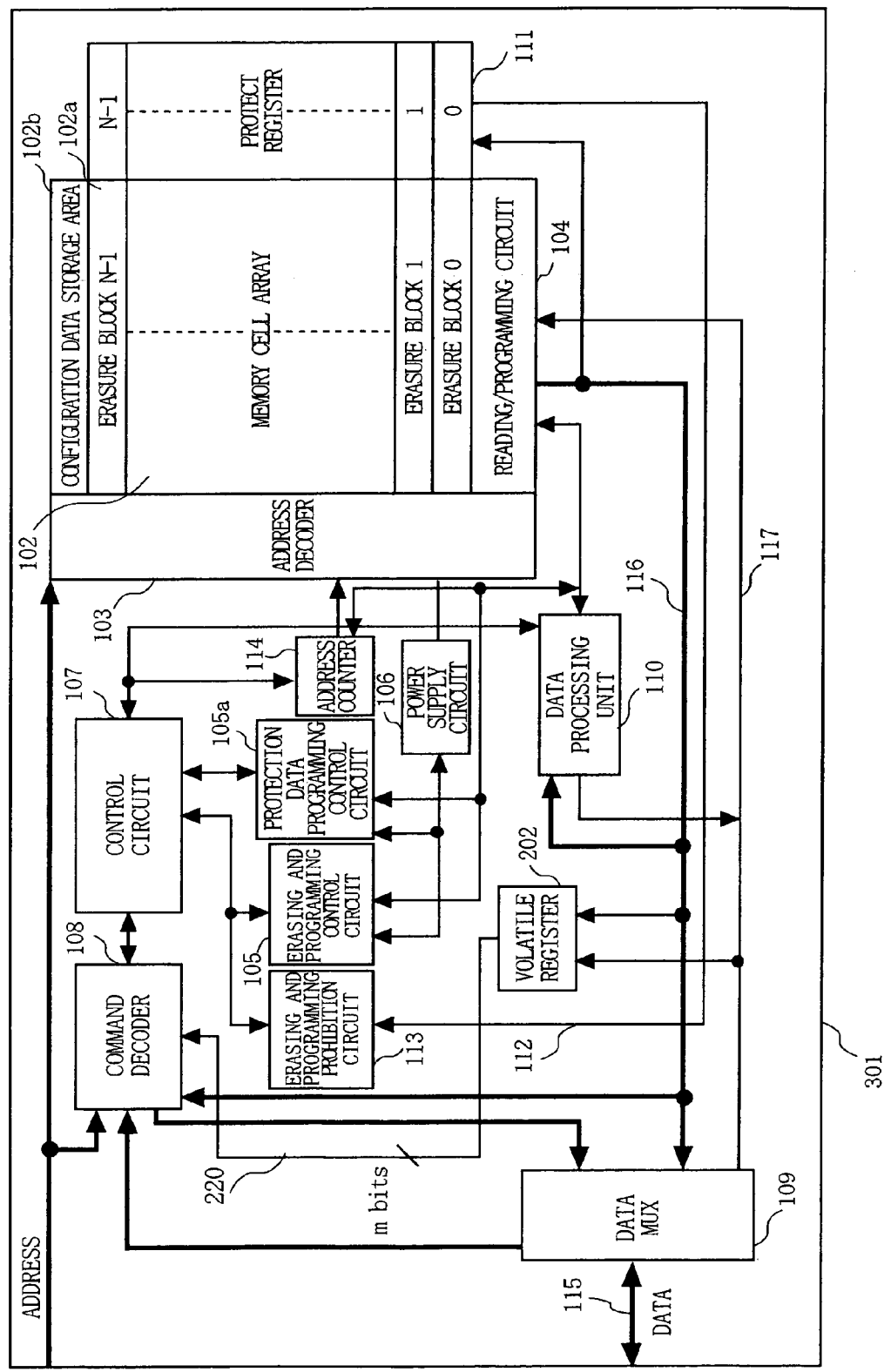
FIG. 3 is a block diagram illustrating a construction of a non-volatile semiconductor storage device according to a third embodiment of the present invention.
Figure 4:
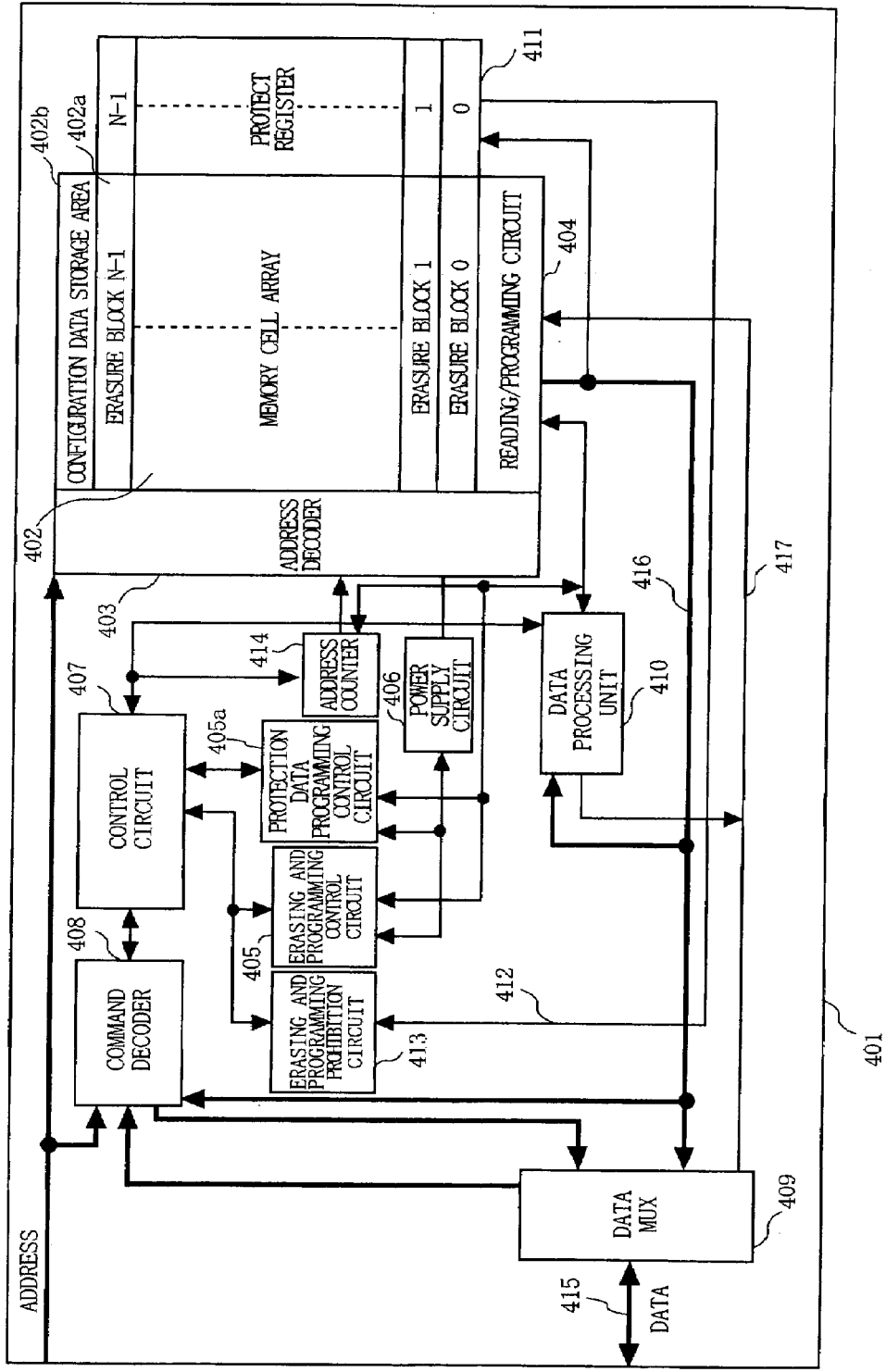
FIG. 4 is a block diagram illustrating a construction of a prior art non-volatile semiconductor storage device.

FIG. 3 is a block diagram illustrating a construction of a non-volatile semiconductor storage device according to a third embodiment of the present invention. In the non-volatile semiconductor storage device 201 according to the second embodiment, data for controlling whether or not the specific command is to be enabled is inputted to the volatile register 202 through the input/output data bus 115 from the outside of the non-volatile semiconductor storage device 201. On the other hand, in the non-volatile semiconductor storage device 301 according to the third embodiment, the data is inputted to the volatile register 202 from the configuration data storage area 102b.

In the non-volatile semiconductor storage device 301, data for controlling whether or not the specific command is to be enabled is stored in the configuration data storage area 102b when initialized. The data are transmitted to the volatile registers 202 by the control circuit 107 at a predetermined timing after the start-up of the non-volatile semiconductor storage device 301. The volatile registers 202 store the transmitted data and output the specific command Enable/Disable signals to the command decoder 108. The execution and prohibition of the specific command are described in the second embodiment and the description thereof is omitted here.

As described above, the non-volatile semiconductor storage device according to this embodiment transmits, to the volatile registers, data for controlling whether or not the specific commands which are stored in the configuration data storage area when initialized are to be enabled at a predetermined timing after the start-up. The volatile registers store the transmitted data and output the specific command Enable/Disable signals to the command decoder. Thereby, even when the specific command is erroneously issued, the specific command can be prevented from being executed.

While the invention has been described in detail, the foregoing description is in all aspects illustrative and not restrictive. It is understood that numerous other modifications and variations can be devised without departing from the scope of the invention.

What is claimed is:

1. A non-volatile semiconductor storage device which operates on the basis of a command, comprising:
   a memory cell array including a plurality of non-volatile memory cells;
   a command decoder for decoding commands externally supplied thereto; and
   a control circuit for controlling the memory cell array on the basis of a result of the decoding performed by the command decoder, wherein
   at least one specific command control signal, for enable/disable control signal, for directly controlling the command decoder so as to determine whether or not at least one command among commands which can be executed is permitted to be executed, is inputted to the command decoder, wherein the at least one command among commands which can be executed is a command for protecting a predetermined memory area or for shifting to a test mode the command decoder outputs the result of the decoding based on the specific command control signal, and the specific command enable/disable control signal is externally supplied thereto.

* * * * *